(12) United States Patent
Andersen et al.

(10) Patent No.: US 7,518,444 B2
(45) Date of Patent: Apr. 14, 2009

(54) PWM FEEDBACK/FEED-FORWARD PROTECTION

(75) Inventors: Jack B. Andersen, Cedar Park, TX (US); Peter G. Craven, Thakeham (GB); Daniel L. W. Chieng, Austin, TX (US); Michael A. Kost, Cedar Park, TX (US)

(73) Assignee: D2Audio Corporation, Milpitas, CA (US)

( * ) Notice: Subject to any disclaimer, the term of this patent is extended or adjusted under 35 U.S.C. 154(b) by 31 days.

(21) Appl. No.: 11/672,191

(22) Filed: Feb. 7, 2007

(65) Prior Publication Data
US 2007/0183490 A1 Aug. 9, 2007

Related U.S. Application Data

(60) Provisional application No. 60/771,146, filed on Feb. 7, 2006.

(51) Int. Cl.
*H03F 3/38* (2006.01)

(52) U.S. Cl. .................... 330/10; 330/207 A
(58) Field of Classification Search ............... 330/10, 330/251, 207 A, 298, 207 P; 375/238
See application file for complete search history.

(56) References Cited

U.S. PATENT DOCUMENTS

| | | | |
|---|---|---|---|
| 4,914,439 A | 4/1990 | Nakahashi | |
| 5,815,584 A | 9/1998 | Whitecar | |
| 6,415,776 B1 | 7/2002 | Gates | |
| 6,418,002 B1 | 7/2002 | Yang | |
| 6,661,679 B1 | 12/2003 | Yang | |
| 6,683,494 B2 | 1/2004 | Stanley | |
| 7,286,010 B2 * | 10/2007 | Chieng et al. .............. | 330/10 |
| 7,327,187 B2 * | 2/2008 | Lee ........................... | 330/10 |
| 2003/0147168 A1 | 8/2003 | Galbraith | |

* cited by examiner

*Primary Examiner*—Robert Pascal
*Assistant Examiner*—Hieu P Nguyen
(74) *Attorney, Agent, or Firm*—Fliesler Meyer LLP

(57) ABSTRACT

Systems and methods for improving the stability of feedback and/or feed-forward subsystems in digital amplifiers. One embodiment comprises a digital pulse width modulation (PWM) controller. The controller includes an input for receiving a digital audio input signal and is configured to generate a PWM output signal based on the input signal at an output. The controller also has control inputs for receiving external audio correction signals such as feedback and power supply feed-forward signals. The controller has correction circuitry for processing the received external control signals and modifying the input signal based on these signals. Fault detectors monitor fault conditions at various locations within the correction circuitry, and a protection control unit receives fault signals from the fault detectors and modifies operation of the controller in response to the fault signals.

22 Claims, 3 Drawing Sheets

PWM FEEDBACK/FEED-FORWARD PROTECTION

RELATED APPLICATIONS

This application claims the benefit of U.S. Provisional Patent Application 60/771,146, filed Feb. 7, 2006, which is incorporated by reference as if set forth herein in its entirety.

BACKGROUND

1. Field of the Invention

The invention relates generally to digital amplifiers, and more particularly to systems and methods for improving the stability of feedback and/or feed-forward subsystems in digital amplifiers.

2. Related Art

In an all digital pulse width modulation (PWM) amplifier system a digital input signal is processed by digital components to produce a PWM signal, which is then used to drive an output stage. The output stage produces an analog signal that is low-pass filtered and used to drive a load such as a loudspeaker.

Digital PWM amplifier systems often include feedback to reduce noise and distortion in the output. The system may also include feed-forward correction, which is based on information other than the amplifier's output, to reduce noise and distortion. In a digital PWM amplifier with digital feedback (using ADCs), part of the feedback loop and feed-forward path, specifically the high voltage output stage and the analog portion of the loop/path, including the analog-to-digital converter (ADC), will be outside the digital PWM device. Because the external loop/path is outside the digital PWM device, it is not always guaranteed to be operating within the parameters for which the PWM device was designed. This may be a result of design errors, user errors, damaged components, etc.

In conventional amplifiers, the entire amplification system is integrated, so the design of the entire feedback loop is known, and the feedback loop can simply be designed to be stable. When the digital portion of the amplifier is designed independently of the analog portions of the amplifier, such as output stage and analog portions of the feedback path, the design of these analog components is not known, and the digital design cannot assume any particular specifications or behavior for the analog components. It is instead necessary for the digital design to be capable of handling any possible behavior by the analog components in order to maintain the stability of the feedback system.

It would therefore be desirable to build feedback/feed-forward (FB/FF) protection into the system, aside from any over-current, shoot-through, and over-temperature protection mechanisms that may be incorporated into the design, in order to counter misbehaved feedback and feed-forward. It would further be desirable for the FB/FF protection to provide not only protection from errors or failures in the FB/FF, but also a graceful transition between normal operation and a disruptive condition. One of the primary goals of such FB/FF protection would be to maintain the stability of the PWM system and to keep audio amplifier operational as long as possible under non-ideal conditions. A secondary goal would be to help prevent damage to the amplifier and the speaker by working in parallel with the other protection mechanisms.

SUMMARY OF THE INVENTION

One or more of the problems outlined above may be solved by the various embodiments of the invention. Broadly speaking, the invention comprises systems and methods for improving the stability of feedback and/or feed-forward subsystems in digital amplifiers. In one embodiment, an all digital PWM amplifier with feedback consists of an open loop feed-forward path, an audio feedback path, power supply tracking, and power supply feed-forward. The amplifier has a series of fault/error detectors built into the system. The amplifier also has built-in FB/FF protection which will monitor and maintain the stability of the feedback system. The FB/FF protection system is able to assert various protection functions to keep the system stable under various disruptive conditions. In this embodiment, the protection functions include opening the feedback loop, freezing power supply tracking, forcing the power supply estimate to unity, and freezing the power supply estimate. The FB/FF protection system can incrementally transition the system between open loop and closed loop states to maintain stability.

Another embodiment comprises a system having a digital pulse width modulation (PWM) controller. The controller includes an input for receiving a digital audio input signal and is configured to generate a PWM output signal based on the input signal at an output. The controller also has control inputs for receiving external audio correction signals such as feedback and power supply feed-forward signals. The controller has correction circuitry for processing the received external control signals and modifying the input signal based on these signals. Fault detectors monitor fault conditions at various locations within the correction circuitry, and a protection control unit receives fault signals from the fault detectors and modifies operation of the controller in response to the fault signals.

In one embodiment, the controller is implemented in a single integrated circuit chip. The controller may be coupled to an output stage to produce an analog audio output signal from the PWM output signal received from the controller. Analog-to-digital converters may be provided to digitize the analog audio output signal (possibly after filtering) and to provide the resulting signal to the controller as feedback, which is then processed by feedback circuitry and used to modify the input signal. The digitized audio output signal can also be provided, along with the input audio signal, to a power supply tracking unit which can then generate a power supply estimate and modify the input signal based on the estimate. Digitized (and possibly filtered) measurements of the power supply voltage(s) are provided in one embodiment to a power supply feed-forward unit, which can then generate a power supply estimate and modify the input signal based on the estimate. The controller may be programmable. In one embodiment, the fault detectors include an analog-to-digital converter (ADC) overload detector, an ADC data error detector, a feedback loop clipping detector, a forward datapath clipping detector, and a modulator shut down detector. In one embodiment, the responses to detected fault conditions may include: opening a feedback loop; closing the feedback loop; ramping up the feedback loop; flushing a power supply tracking unit; freezing a power supply estimate generated by the power supply tracking unit.

Yet another embodiment comprises a method implemented in a digital pulse width modulation (PWM) controller. The method includes receiving a digital audio input signal and generating a corresponding PWM output signal, receiving digital audio correction signals and modifying the input signal based on these signals, detecting fault conditions in the controller, and modifying operation of the controller in response to detecting the fault conditions. The PWM output signal output by the controller may be used to generate an analog output signal. The audio correction signals may be feedback or feed-forward signals which are filtered if necessary, digitized and provided to the controller. A feedback signal may be compared to the input signal to generate a difference which can be used to modify the input signal. One of the audio correction signals may be a feed-forward power supply measurement that can be processed and used to modify the input audio signal. Detecting the fault signals may, for example, comprise detecting an analog-to-digital converter (ADC) overload, detecting an ADC data error, detecting feedback loop clipping, detecting forward datapath clipping, or detecting modulator shut down. Modifying operation of the controller may, for example, comprise opening a feedback loop, closing the feedback loop, ramping up the feedback loop, flushing a power supply tracking unit, or freezing a power supply estimate generated by the power supply tracking unit.

Numerous other embodiments and variations are also possible.

BRIEF DESCRIPTION OF THE DRAWINGS

Other objects and advantages of the invention may become apparent upon reading the following detailed description and upon reference to the accompanying drawings.

Figure 1:
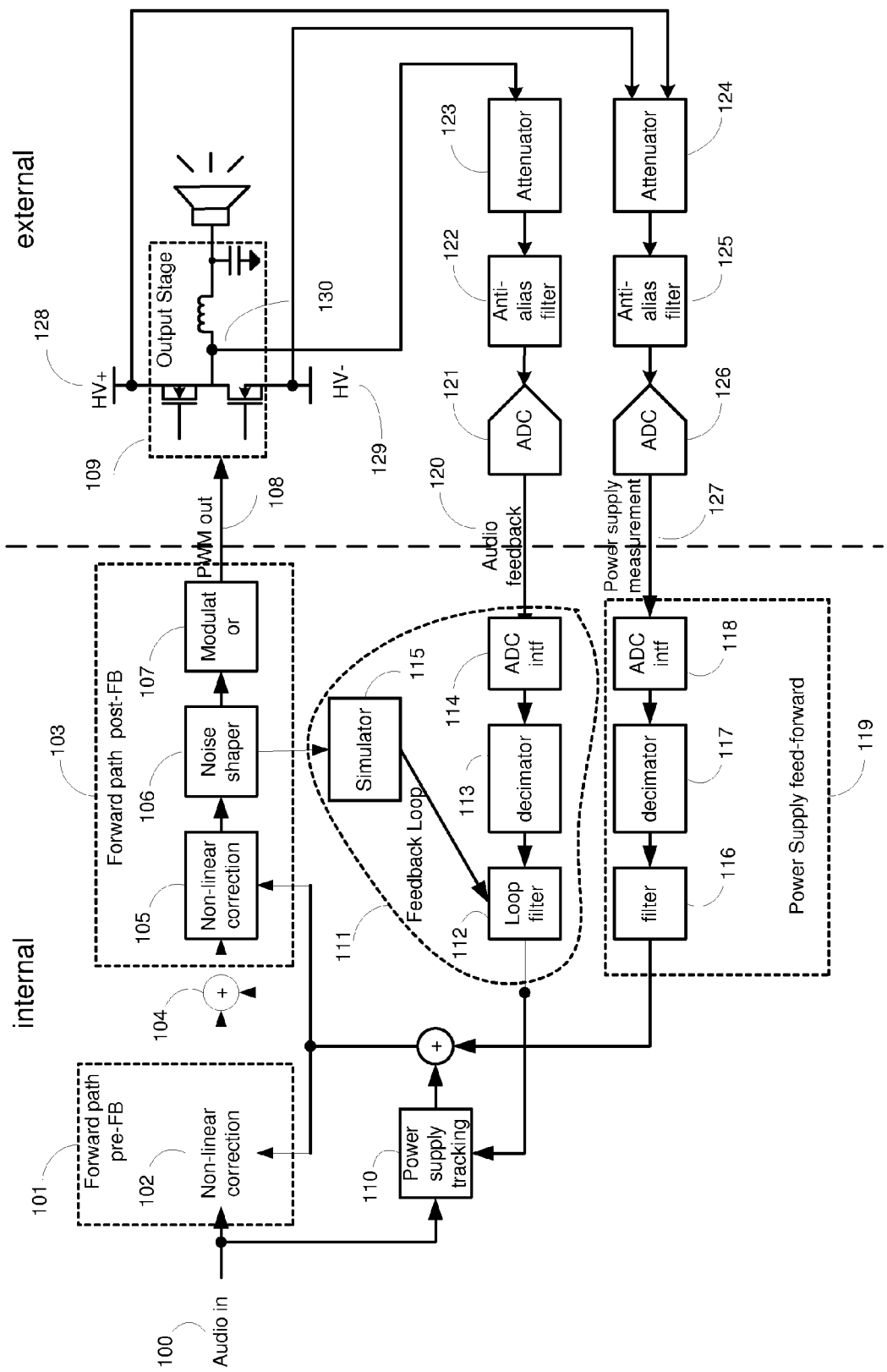
FIG. 1 is a block diagram illustrating the different sections of a digital PWM amplification system with audio feedback and power supply feed-forward correction in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for improving the stability of feedback and/or feed-forward subsystems in digital amplifiers.

In an all digital PWM amplifier system with digital feedback (using ADCs), part of the feedback loop and feed-forward path—specifically the high voltage and the analog portion of the loop/path including the ADC—will be outside the device. The external loop/path is not always guaranteed to be operating within the specified parameters. This may be a result of design errors, user errors, or damaged components, etc. Consequently, the stability of the feedback system must be monitored. Aside from the over-current, shoot-through, and over-temperature protection mechanisms that may be incorporated into the system, feedback/feed-forward (FB/FF) protection should now be built into the system to counter misbehaved feedback and feed-forward. At the same time, the FB/FF protection can provide a graceful transition between normal operation and a disruptive condition. The primary goal of the FB/FF protection is to maintain the stability of the PWM system and to keep audio amplifier operational as long as possible under non-ideal conditions. A secondary goal is to help prevent damage to the amplifier and the speaker by working in parallel with the other PWM protection mechanisms.

In one embodiment, a digital PWM amplifier with feedback may be divided into 5 sections as shown in FIG. 1. These sections (identified as internal in the figure) include: a) forward path before feedback, b) forward path after feedback, c) feedback loop (FB), d) power supply tracking (PST), and e) power supply feed-forward (PSFF). FIG. 1 illustrates the interconnection of the various sections.

"Forward path pre-FB" and "forward path post-FB" make up the main open-loop feed-forward path through which the digital input signal is processed to produce the PWM output signal. PSFF provides power supply noise/ripple rejection by providing a correction factor to a power supply estimate (PSE) to the main forward path. PSE is nominally set to 1 when there is no PSFF or PST, i.e., it is assumed that the power supply is perfect. PSE is a multiplicative factor or "gain" applied to the input audio signal before the signal is converted to a PWM signal for output. With the PSFF and/or PST capability, the PSE can be adjusted by sensing the actual power supply level with the goal of keeping the output level at the correct level. For example, if the power supply drops by 5%, 5% is added to the PSE. This 5% added to the PSE is the "correction factor". Alternatively, PST may be enabled to reduce the effect of 120 Hz tone and other low frequency ripples in the power supply by providing the correction to PSE. FB loop is the main audio feedback to correct for audio imperfection.

Audio feedback consists of analog-to-digital (A/D) converted samples of the PWM amplifier output. The PWM output is typically a high voltage signal which must first be attenuated, low-pass filtered, and then fed into the ADC, in which it is sampled and digitized. Power supply measurement is similar to the audio feedback, except that the samples consist of the power supply voltage.

FIG. 1 is a block diagram illustrating the different sections of a digital PWM amplification system with audio feedback and power supply feed-forward correction. The system is partitioned into on-chip (internal) PWM controller circuitry and off-chip (external) circuitry. The on-chip circuitry consists of a pre-feedback forward path (101), a post-feedback forward path (103), a feedback loop (111), a power supply feed-forward path (119), and power supply tracking unit (110). The off-chip circuitry consists of an output stage (109), attenuators (123, 124), anti-alias filters (122, 125), and ADC converters (121, 126).

The pre-feedback forward path usually performs non-linear and power supply correction in a first non-linear correction unit (102). The post-feedback path performs additional non-linear and power supply correction in a second non-linear correction unit (105). The post-feedback path also includes a noise shaper (106) and a modulator (107). The feedback loop in this embodiment consists of a simulator (115), an ADC interface (114), a decimator (113) and a loop filter (112). The power supply feed-forward path consists of an ADC interface (118), a decimator (117), and a filter (116).

Audio signal (100) is received by the PWM controller and is first corrected for non-linearity and power supply fluctuations. A feedback signal from the feedback loop (111) is then added (104) to the pre-corrected input signal. Additional correction is applied to the signal by the second non-linear correction unit (105) after the feedback signal is added. The resulting signal is noise shaped (106) before being modulated (108) and provided as output from the PWM controller. The PWM output drives the output stage (109) which may have a half-bridge or full-bridge configuration.

The high voltage output (130) is sampled, attenuated (123), low-pass filtered (122), and converted to a digital signal (121). The digitized bit stream is input to the PWM controller through the ADC interface (114), which de-serializes the bit stream. The output of the ADC interface (114) is decimated (113), subtracted from the simulator output, filtered (112), and routed to the power supply tracking block (110), as well as being added (104) to the output of the first non-linear correction unit (102). At the same time, the high voltage supplies (128,129) of the output stage are sampled, attenuated (124), low-pass filtered (125), digitized by another ADC (126), and routed to a second ADC interface (118). The digitized output of the ADC interface is decimated (117) and filtered (116) before the output is summed with the output of the power supply tracking unit (110) and routed to the non-linear correction units (101, 103) for power supply correction.

Traditionally, feedback systems keep the feedback loop inside the device. Phase and gain margins are specified and designed into the system so that loop stability is guaranteed. However, in the all-digital PWM feedback system described here, part of the loop is outside the device, and is interfaced to the PWM controller through the ADC's. Many things could go wrong in the external portion of the loop that will cause the feedback loop to go unstable and could subsequently cause damage to the end system. Additionally, a user may also incorrectly program the PWM engine, which could be fatal to a system without any protection.

It is difficult to alter the loop filter characteristics on the fly without first shutting down the system. Moreover, it is also difficult to predict in real time the compensation needed to correct for the anomaly. The alternative is to transition the PWM amplifier into a known stable state, which is usually open-loop, then clean up the feedback/feed-forward paths, and then close the loop again.

Source, Detection, and Reaction to Errors

They are many sources of error conditions including:
1) Unexpected external analog circuit behavior in the feedback/feed-forward path. For instance, if the attenuator fails to reduce the signal to the proper level, the anti-alias filter will clip, which will likely cause the ADC to overload;
2) Broken external analog circuits including ADC—short, open, or over-stressed. A damaged circuit can result in unpredictable behavior. If the input to the ADC is over-ranged due to damage in the front end circuits, the ADC will overload;
3) Unexpected digital filter characteristics in the feedback/feed-forward path. There are digital filters in the loop/path that are designed to compensate for the analog filters, and if the criteria and assumptions used to design the digital filters no longer match the characteristics of the analog filters, the stability of the feedback loop is no longer guaranteed;
4) Faulty calibration—gain and offset. Signal gain and offset are optimized in the analog path to maximize the dynamic range of the ADC, and the gain and offset are compensated in the device during the calibration. Incorrect compensation can influence the stability;
5) Miscalculation of power supply estimate (PSE). PSE calculation relies on the accurate measurement of the power supply (external) and proper digital filter design (internal). Incorrect PSE will create errors in the signal path, as PSE is a multiplicative parameter;
6) Shut down. Cycle-by-cycle shut down and permanent shut down initiated by circuitry intended to prevent damage to the output stage must also be considered when closing the feedback loop. Not taking into account the shut down could cause the loop to saturate.

Error conditions cannot be predicted and prevented from happening, but they certainly can be detected. A convenient way to do this is to monitor the ADC interface and various check points along the feedback loop and feed-forward path. For example, at the ADC interface, the bit patterns generated by the interface can be examined to determine if the ADC overloaded. The frequency of the input data rate and the output data rate can also be compared to detect framing errors. The feedback loop and feed-forward path can also be monitored for signal clipping, or for the signal exceeding some maximum allowable range. Error detection can be set up to assert corresponding signals after the errors have occurred, or when the errors are on the verge of occurring.

The response to a particular error condition varies depending on the type of error. Reactions to an error may include:
1) Opening the feedback loop;
2) Closing/ramping up the feedback loop;
3) Freezing power supply tracking (PST);
4) Flushing PST;
5) Freezing PSE;
6) Forcing PSE to unity;

Hardware Design

Figure 2:
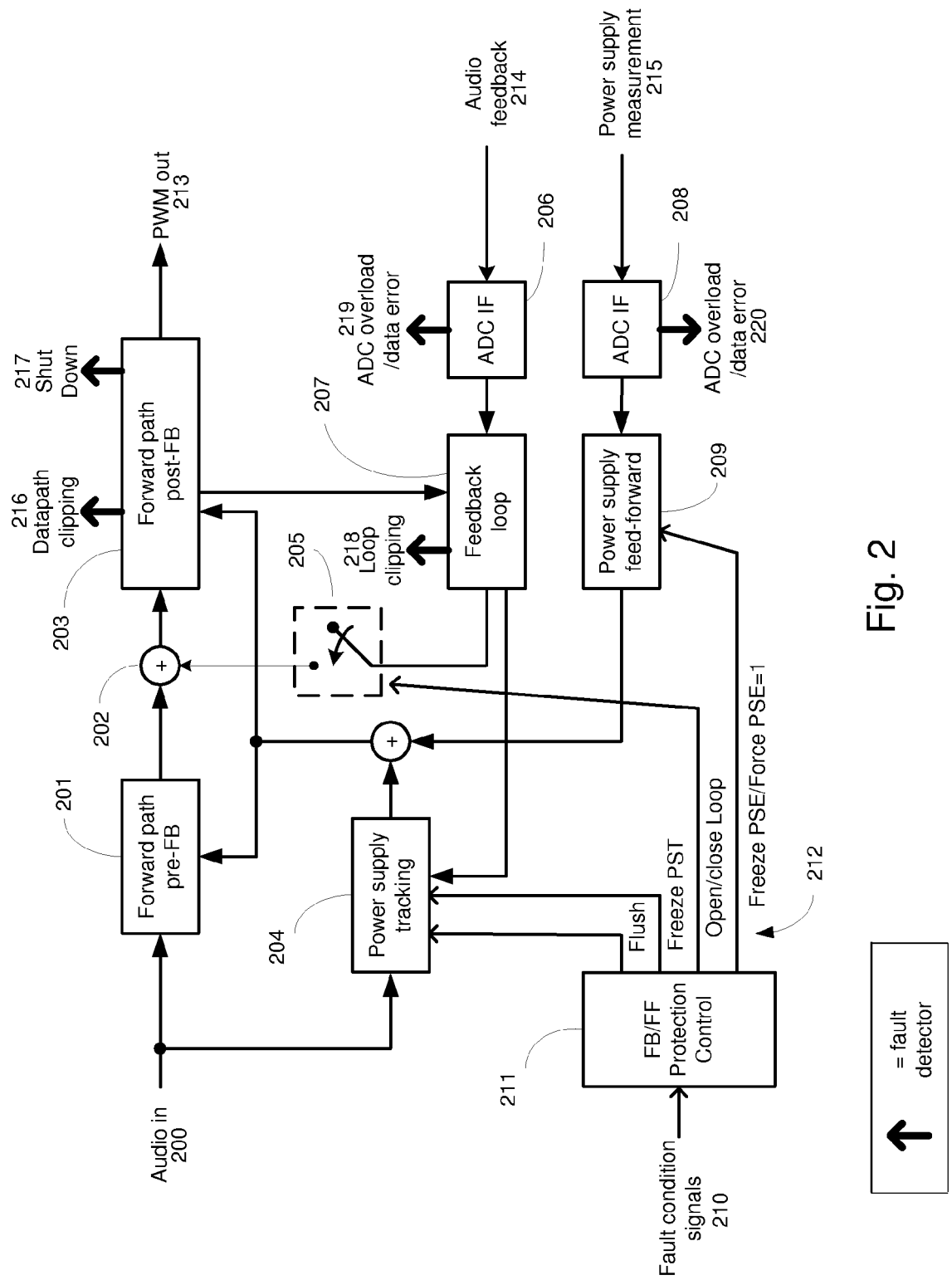
FIG. 2 is a functional block diagram illustrating the structure of an exemplary digital PWM controller with feedback and feed-forward protection.

The FB/FF protection system monitors various checkpoints along the PWM data paths including the ADC interfaces. FIG. 2 shows some the locations where fault detectors are installed in an exemplary system. The FB/FF protection system responds when any of the fault detectors sense an error condition. In one embodiment, the FB/FF protection system is a programmable hardware entity which is separate from, but configurable by the DSP. Once programmed by the DSP, the FB/FF protection system will provide protection with little DSP intervention.

FIG. 2 is a functional block diagram illustrating the structure of an exemplary digital PWM controller with feedback and feed-forward protection. The feedback/feed-forward protection control unit (211) processes the input fault conditions (210) which are detected by the fault detectors (216, 217, 218, 219, 220,) that are located at different points throughout the system. The protection control unit (211) responds to the detected fault conditions by asserting output control signals (212).

The input fault conditions that may be detected in this embodiment include data path clipping (216), feedback loop clipping (218), shut down in the modulator (217), ADC overload (219, 208), and ADC data error (208). The output control signals (212) responsive to these conditions are routed to power supply tracking (204), feedback loop (205), and power supply feed-forward path (209). The actions to be taken for power supply tracking may include, for example, flushing or freezing the power supply tracking (204,) freezing or forcing unity gain for the power supply feed-forward path (209,) and opening/closing of feedback path (205).

Figure 3:
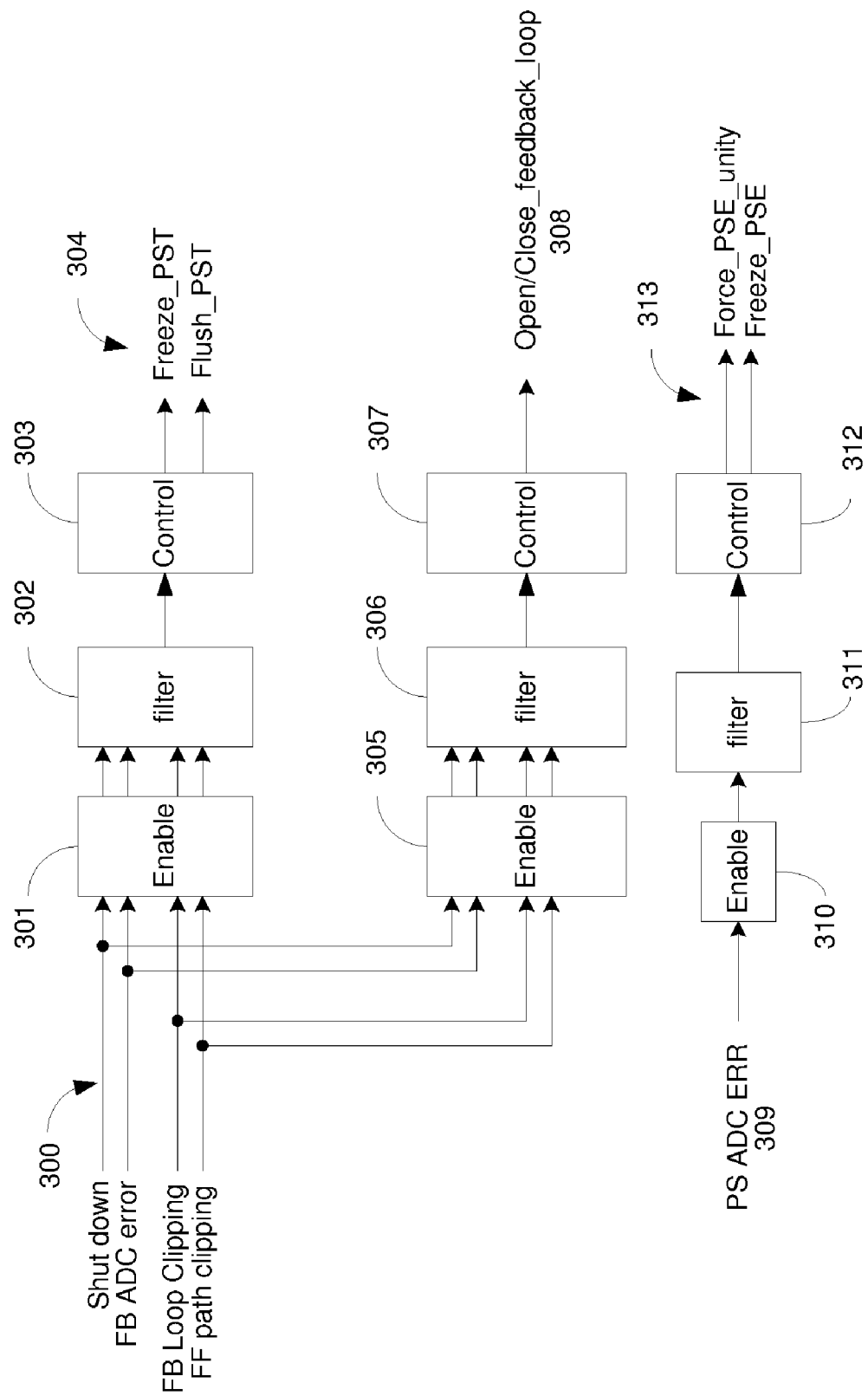
FIG. 3 is a functional block diagram illustrating the structure of a feedback/feed-forward protection control unit in accordance with one embodiment.

Inputs to the FB/FF protection system are error signals from the fault detectors. These error signals may be low-pass filtered so that the FB/FF protection system only responds when a consecutive number of error events have occurred. In the exemplary system, inputs consist of ADC overload, ADC data error, PWM shut down, feedback loop clipping, and forward path clipping signals. FIG. 3 shows the FB/FF protection system hardware structure in one embodiment:

FIG. 3 is a functional block diagram illustrating the structure of the feedback/feed-forward protection control unit. The unit consists of enable units (301, 305, 310) which engage or disengage the protection control, and associated filters (302, 306, 311) and control block (303, 307, 312). The fault condition signals (300, 309) are digital signals that are passed through the enable units when the corresponding protection is enabled. The signals are low-pass filtered to remove high frequency glitches, and the filtered signals are provided to the control blocks to allow them to determine the proper actions to be taken (304, 308, 313.)

Filters are simple low-pass filters. Their sole purpose in this embodiment is to remove sporadic fault conditions. Programmable delays are used to allow time for PST to be flushed so that PSE stays clean. It may also be used to flush out the feedback loop before closing the loop again.

Hardware Functions

The FB/FF protection system reacts differently to different types of errors. The FB/FF protection system control outputs can be divided into 3 groups: a) open/close feedback loop, b) freeze/flush power supply tracking, and c) freeze PSE/force PSE to unity. In one embodiment, the system may react in the following ways:

1) Open the feedback loop—simply disconnect the feedback path internally;
2) Freeze PST—"Freezing" the power supply tracking (PST) means maintaining the last power supply estimate (PSE). By freezing the PST, the PSE will remain constant and thus prevent possible overload;
3) When all errors are cleared by the DSP, PST will resume and FB loop will slowly ramp back up to the programmed level. Software will read the error status and take action to remedy the situation. Once the software is done, it can restart the feedback by allowing PST to resume power supply estimates, and allow the feedback loop to slowly close again by changing the loop gain incrementally from, for example, 0 to 1;
4) Force PSE to unity—when there is no PSFF or PST, the power supply estimate is assumed to be perfect, that is gain=1. By forcing the PSE to 1, PSFF and PST are effectively removed, so any error in the PSFF or PST will no longer affect the signal.

The responses can be grouped together, based on the types of errors that are encountered. The types of errors fall generally into 3 categories. These categories are listed below, with the corresponding responses.

1) For the following types of error:
   PWM permanent shut down—set until cleared by DSP
   Feedback ADC error
   Feedback loop clipping
   Main path signal clipping
   the FB/FF protection system will typically:
   open the feedback loop;
   freeze PST; and
   when all errors are cleared by the DSP, PST will resume and FB loop will slowly ramp back up to the programmed level.

Shut down can be handled in two different ways: 1) set until cleared by DSP, and 2) clear and set every PWM switch period. The latter is needed in the present embodiment so that the FB/FF protection system can deal with cycle-by-cycle shut down in the PWM modulator.

Feedback ADC error can be ADC clipping or data error. The ADC interface continuously checks the ADC modulator output for patterns which indicate overload/overflow. It also checks the input and output data rate for ADC framing error.

Feedback loop clipping is another important indicator that the system may be on the verge of becoming unstable. Many other factors can contribute to this problem as well.

Excessive signal clipping in the main path may also indicate problems.

2) For the following type of error:
   PWM shut down—clear and set every PWM switch period, the FB/FF protection system will typically:
   open the feedback loop;
   freeze PST; and
   when the error stops, PST will resume and FB loop will slowly ramp back up to the programmed level. No DSP intervention is needed.

3) For the following type of error:
   Power supply feed-forward (PSFF) ADC error,
   the FB/FF protection system has 3 options:
   Freeze PSE;
   Force PSE to unity; or
   Do nothing.

The PSFF block has a low-pass filter which continuously averages the power supply estimate. In normal operation, the instantaneous estimate is fed to the PSE. When the FB/FF protection system is asserted, PSE will either take the average value or be forced to unity.

Those of skill in the art will understand that information and signals may be represented using any of a variety of different technologies and techniques. For example, data, information, signals, bits, and the like that may be referenced throughout the above description may be represented by voltages, currents, electromagnetic waves, or the like, including combinations thereof. The information and signals may be communicated between components of the disclosed systems using any suitable transport media, including wires, metallic traces, and so on.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system comprising:
a digital pulse width modulation (PWM) controller;
wherein the controller includes
a first input configured to receive a digital audio input signal,
a first output configured to provide a PWM output signal based on the input signal,
one or more control inputs configured to receive audio correction signals from corresponding sources external to the controller,
correction circuitry configured to modify the input signal based on the audio correction signals,
one or more fault detectors configured to monitor the received audio correction signals to identify corresponding fault conditions, and
a protection control unit configured to receive fault signals indicative of the fault conditions from the fault detectors and to modify operation of the controller in response to the fault signals.

2. The system of claim 1, wherein the controller is implemented in a single integrated circuit chip.

3. The system of claim 2, further comprising an output stage configured to receive the PWM output signal from the controller and to produce an analog audio output signal.

4. The system of claim 3, further comprising an analog-to-digital converter (ADC) configured to digitize the analog audio output signal and to provide the resulting digitized audio output signal to one of the control inputs of the controller, wherein the correction circuitry comprises feedback circuitry configured to modify the input signal based on the digitized audio output signal.

5. The system of claim 4, further comprising a filter configured to filter the analog audio output signal prior to the ADC digitizing the analog audio output signal.

6. The system of claim 4, wherein the feedback circuitry includes a power supply tracking unit configured to receive the input signal and the digitized audio output signal and to generate a power supply estimate, wherein the controller is configured to modify the input signal based on the power supply estimate.

7. The system of claim 6, further comprising a filter configured to filter the analog audio output signal prior to the ADC digitizing the analog audio output signal.

8. The system of claim 1, further comprising a power supply, a power supply measurement unit and an analog-to-digital converter (ADC) external to the controller, wherein the power supply measurement unit is configured to provide a measurement of the power supply to the ADC, wherein the ADC is configured to digitize the power supply measurement and to provide the resulting power supply measurement to one of the control inputs of the controller, and wherein the correction circuitry comprises power supply feed-forward circuitry configured to modify the input signal based on the digitized power supply measurement.

9. The system of claim 1, wherein the protection control unit comprises a digital signal processor (DSP) which is programmable to enable the DSP to modify operation of the controller in response to the fault signals.

10. The system of claim 1, wherein the fault detectors include an analog-to-digital converter (ADC) overload detector, an ADC data error detector, a feedback loop clipping detector, a forward datapath clipping detector, and a modulator shut down detector.

11. The system of claim 1, wherein the protection control unit is configured to modify operation of the controller by taking an action selected from the group consisting of: opening a feedback loop; closing the feedback loop; ramping up the feedback loop; flushing a power supply tracking unit; and freezing a power supply estimate generated by the power supply tracking unit.

12. A method implemented in a digital pulse width modulation (PWM) controller, the method comprising:
receiving a digital audio input signal;
generating a PWM output signal based on the input signal;
receiving one or more digital audio correction signals;
modifying the input signal based on the digital audio correction signals;
monitoring the received audio correction signals to detect one or more fault conditions; and
modifying operation of the controller in response to detecting the fault conditions.

13. The method of claim 12, wherein all the steps of claim 12 are performed in a single integrated circuit chip.

14. The method of claim 13, further comprising generating an analog audio output signal based on the PWM output signal.

15. The method of claim 14, further comprising: digitizing the analog audio output signal to produce one of the digital audio correction signals.

16. The method of claim 15, further comprising filtering the analog audio output signal prior to digitizing the analog audio output signal.

17. The method of claim 15, further comprising generating a power supply estimate based on a difference between the digital audio input signal and the digitized audio output signal, and modifying the input signal based on the power supply estimate.

18. The method of claim 17, further comprising filtering the analog audio output signal prior to digitizing the analog audio output signal.

19. The method of claim 12, further comprising providing a digitized measurement of a power supply to one of the digital audio correction signals and modifying the input signal based on the digitized power supply measurement.

20. The method of claim 12, wherein modifying operation of the controller in response to detecting the fault signals comprises taking one or more programmable actions in response to detecting corresponding ones of the fault signals.

21. The method of claim 12, wherein detecting the fault signals comprises detecting an analog-to-digital converter (ADC) overload, detecting an ADC data error, detecting feedback loop clipping, detecting forward datapath clipping, and detecting modulator shut down.

22. The method of claim 12, wherein modifying operation of the controller comprises taking an action selected from the group consisting of: opening a feedback loop; closing the feedback loop; ramping up the feedback loop; flushing a power supply tracking unit; and freezing a power supply estimate generated by the power supply tracking unit.

* * * * *

UNITED STATES PATENT AND TRADEMARK OFFICE
CERTIFICATE OF CORRECTION

| | | |
|---|---|---|
| PATENT NO. | : 7,518,444 B2 | Page 1 of 1 |
| APPLICATION NO. | : 11/672191 | |
| DATED | : April 14, 2009 | |
| INVENTOR(S) | : Jack B. Andersen et al. | |

It is certified that error appears in the above-identified patent and that said Letters Patent is hereby corrected as shown below:

At Column 5, Line 43, replace "They" with --There--;

At Column 6, Line 52, replace "(219, 208)" with --(219, 220)--;

In Claim 12, at Column 10, Line 26, after "monitoring the" insert --one or more--;

In Claim 20, at Column 10, Line 54, replace "signals" with --conditions--;

In Claim 20, at Column 10, Line 56, replace "signals" with --conditions--;

In Claim 21, at Column 10, Line 58, replace "signals" with --conditions--.

Signed and Sealed this

Twenty-eighth Day of July, 2009

JOHN DOLL
*Acting Director of the United States Patent and Trademark Office*